United States Patent
Kondo et al.

(10) Patent No.: US 7,820,740 B2
(45) Date of Patent: Oct. 26, 2010

(54) FLAME RETARDANT ADHESIVE COMPOSITION, AND ADHESIVE SHEET, COVERLAY FILM AND FLEXIBLE COPPER-CLAD LAMINATE USING SAME

(75) Inventors: Kazunori Kondo, Kamisu (JP); Shigehiro Hoshida, Narita (JP); Tadashi Amano, Kamisu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 442 days.

(21) Appl. No.: 11/865,330

(22) Filed: Oct. 1, 2007

(65) Prior Publication Data

US 2008/0241452 A1    Oct. 2, 2008

(30) Foreign Application Priority Data

Oct. 2, 2006 (JP) ............................. 2006-271068

(51) Int. Cl.
*H01B 3/40* (2006.01)
(52) U.S. Cl. ..................... 523/451; 525/530; 428/344
(58) Field of Classification Search ................. 523/451; 525/530; 428/344
See application file for complete search history.

(56) References Cited

U.S. PATENT DOCUMENTS

| | | | |
|---|---|---|---|
| 7,101,923 B2 * | 9/2006 | Campbell et al. | ............ 524/133 |
| 2005/0014875 A1 * | 1/2005 | Knop et al. | .................. 524/126 |
| 2006/0234043 A1 | 10/2006 | Nakanishi et al. | |
| 2006/0234044 A1 | 10/2006 | Nakanishi et al. | |
| 2006/0234045 A1 | 10/2006 | Nakanishi et al. | |
| 2006/0264538 A1 | 11/2006 | Nakanishi et al. | |
| 2007/0111010 A1 * | 5/2007 | Kaprinidis | .................. 428/413 |

FOREIGN PATENT DOCUMENTS

| | | |
|---|---|---|
| JP | 2001-19930 | 1/2001 |
| JP | 2001-339131 | 12/2001 |
| JP | 2001-339132 | 12/2001 |
| JP | 2002-60720 | 2/2002 |

\* cited by examiner

*Primary Examiner*—Bernard Lipman
(74) *Attorney, Agent, or Firm*—Oblon, Spivak, McClelland, Maier & Neustadt, L.L.P.

(57) ABSTRACT

The present invention provides a halogen-free, flame retardant adhesive composition that exhibits excellent anti-migration properties, not only within single layer structures, but also within multilayer structures of much higher density such as copper-clad laminates.

The flame retardant adhesive composition according to the present invention comprises: (A) a halogen-free epoxy resin, (B) a carboxyl group-containing acrylic resin and/or a carboxyl group-containing acrylonitrile-butadiene rubber, (C) a curing agent, (E) specific phosphinate and/or diphosphonate compounds, and (F) an ion scavenger and/or a heavy metal deactivator.

16 Claims, 1 Drawing Sheet

FLAME RETARDANT ADHESIVE COMPOSITION, AND ADHESIVE SHEET, COVERLAY FILM AND FLEXIBLE COPPER-CLAD LAMINATE USING SAME

BACKGROUND OF THE INVENTION

1. Field of the Invention

The present invention relates to an adhesive composition that is halogen-free, and yields a cured product, upon curing, that exhibits excellent flame retardancy and anti-migration properties, and also relates to an adhesive sheet, a coverlay film, and a flexible copper-clad laminate that use such a composition.

2. Description of the Prior Art

In recent years, developments within the electronics field have been remarkable, and in particular, communication and consumer electronic devices have seen considerable progress in terms of device miniaturization, weight reduction, and increased component density. Demand for this type of improved performance continues to grow. In response to these demands, flexible printed wiring boards exhibit favorable flexibility and are resistant to repeated bending, meaning they can be packaged three dimensionally at a high density within a confined space. Accordingly, they are being used more and more widely as composite components that include functions such as the wiring, cabling or connectors to electronic equipment.

A flexible printed wiring board is produced by forming a circuit on a flexible printed wiring board substrate using normal methods, and then depending on the intended use of the wiring board, bonding a coverlay film to the board to protect the circuit. The flexible printed wiring board substrate used in the flexible printed wiring board is a laminate prepared by using an adhesive to bond a metal foil to an electrically insulating film that exhibits a high level of heat resistance as well as excellent electrical and mechanical properties. The properties required for the flexible printed wiring board substrate include favorable adhesion durability, as well as favorable levels of heat resistance, flexibility, foldability, anti-migration properties, and flame retardancy. Furthermore, an adhesive sheet refers either to a sheet that is used for laminating together two or more single-sided or double-sided copper foil flexible printed wiring boards, thereby forming a multilayer structure, or to a sheet that is used for bonding a reinforcing sheet to a flexible printed wiring board. The properties required for such adhesive sheets include favorable adhesive strength, heat resistance, and anti-migration properties.

Against the background of recent environmental problems, there is a growing trend to limit the use of halogen compounds in components mounted within electronic equipment, meaning the use of bromine compounds, which have conventionally been widely used to impart flame retardancy to the materials used for flexible printed wiring board substrates, is becoming increasingly difficult.

As a result of the environmental problems mentioned above, recently, a technique has been adopted in which a phosphorus-based flame retardant compound is added to the adhesive instead of a bromine compound in order to achieve the required flame retardancy. For example, resin compositions have been proposed that comprise an epoxy resin, a phosphate ester compound, a phenol-based curing agent, and an NBR rubber as the primary components (see patent reference 1 and patent reference 2). However, phosphate esters exhibit poor resistance to moisture and heat, meaning that under conditions of high temperature and high humidity, the phosphate ester generates ionic components via hydrolysis, resulting in unsatisfactory levels of anti-migration properties, peel properties and solvent resistance. Furthermore, compositions comprising a phosphazene compound, a polyepoxy compound, a curing agent, a curing accelerator, a synthetic rubber and an inorganic filler have also been proposed (see patent reference 3 and patent reference 4), but the peel properties, solvent resistance and solder heat resistance of the resulting substrates are not entirely satisfactory.

Moreover, research by the inventors of the present invention has revealed that even if a composition exhibits excellent anti-migration properties within widely used conventional single layer structures, if a plurality of flexible printed wiring board substrates are laminated together to increase the circuit density, or if other heat loading (heat history) is applied repeatedly, then the resulting anti-migration properties may be inadequate. Accordingly, further improvements in the anti-migration properties are required.

[Patent Reference 1] JP 2001-339131A
[Patent Reference 2] JP 2001-339132A
[Patent Reference 3] JP 2001-19930A
[Patent Reference 4] JP 2002-60720A

SUMMARY OF THE INVENTION

Accordingly, an object of the present invention is to provide an adhesive composition which, although being halogen-free, exhibits excellent flame retardancy, adhesiveness and heat resistance, and not only exhibits excellent anti-migration properties within widely used conventional single layer structures, but also exhibits excellent anti-migration properties within multilayer structures of much higher density. Another object of the present invention is to provide an adhesive sheet, a coverlay film, and a printed substrate material such as a copper-clad laminate that use this adhesive composition.

As a result of intensive research aimed at achieving the above objects, the inventors of the present invention discovered that by using a specific phosphinate compound as a flame retardant component, and also employing an ion scavenger and/or a heavy metal deactivator as essential components, the problems described above could be resolved, and they were therefore able to complete the present invention.

In other words, the present invention provides a flame retardant adhesive composition comprising:

(A) a halogen-free epoxy resin, (B) a carboxyl group-containing acrylic resin and/or a carboxyl group-containing acrylonitrile-butadiene rubber, (C) a curing agent, (E) a phosphinate represented by a general formula (1) shown below and/or a diphosphinate represented by a general formula (2) shown below:

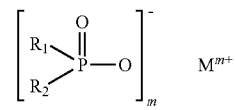

(1)

(wherein, $R_1$ and $R_2$ may be either the same or different, and each represent a monovalent linear or branched alkyl group of 1 to 6 carbon atoms or an aryl group preferably of 6 carbon atoms, M represents a metal selected from the group consisting of Mg, Ca, Al, Sb, Sn, Ge, Ti, Zn, Fe, Zr, Ce, Bi, Sr, Mn, Li, Na and K, or a protonated nitrogen base, and m represents an integer from 1 to 4),

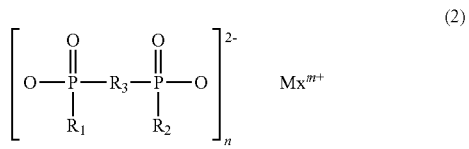

(2)

(wherein, $R_1$, $R_2$, M and m are as defined above, $R_3$ represents a bivalent linear or branched alkylene group of 1 to 10 carbon atoms, an arylene group of 6 to 10 carbon atoms, an alkylarylene group of 6 to 10 carbon atoms, or an arylalkylene group of 6 to 10 carbon atoms, n represents an integer from 1 to 4, and x represents an integer from 1 to 4, provided that 2n=mx), and (F) an ion scavenger and/or a heavy metal deactivator.

Furthermore, the present invention also provides an adhesive sheet having a releasable base material, and a layer comprising the above adhesive composition formed on one surface of the base material. This adhesive sheet is obtained by applying the adhesive composition to a base material having favorable releasability.

Moreover, the present invention also provides a coverlay film, having an insulating film, and a layer comprising the above composition provided on at least one surface of the insulating film. This coverlay film is obtained by applying the adhesive composition to an insulating film.

Furthermore, the present invention also provides a flexible copper-clad laminate, having an electrically insulating film, a layer comprising the above adhesive composition provided on either one surface or both surfaces of the insulating film, and either a single copper foil layer or two copper foil layers provided on top of the one or two layers of the adhesive composition. This flexible copper-clad laminate is obtained by using the adhesive composition to bond the electrically insulating film and the copper foil together.

The composition of the present invention yields a cured product, upon curing, that exhibits excellent flame retardancy, adhesiveness and heat resistance, displays superior anti-migration properties to conventional products, and is also halogen-free. Accordingly, adhesive sheets, coverlay films, and flexible copper-clad laminates prepared using this composition also exhibit excellent flame retardancy, adhesiveness and heat resistance, and even multilayer (laminate) structures that have been subjected to repeated heat loading (heat history) exhibit superior anti-migration properties.

DETAILED DESCRIPTION OF THE PREFERRED EMBODIMENTS

<Flame Retardant Adhesive Composition>

Figure 1:
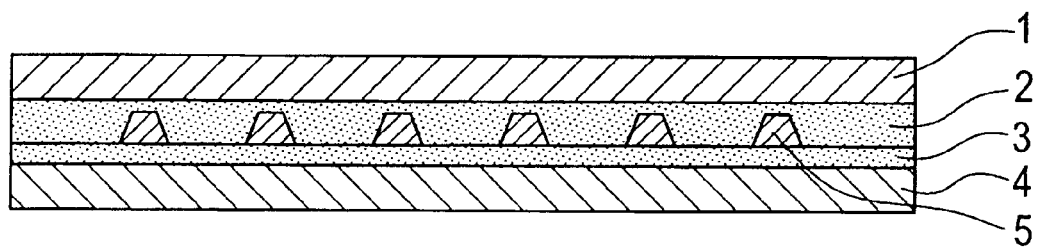
FIG. 1 is a longitudinal cross-sectional view showing an outline of the cross-sectional structure of a test specimen used for evaluating the anti-migration properties of a single layer structure.

As follows is a detailed description of the various structural components of the flame retardant adhesive composition of the present invention.

[Halogen-free Epoxy Resin (A)]

A halogen-free epoxy resin of the component (A) is an epoxy resin that contains no halogen atoms such as bromine within the molecular structure. There are no particular restrictions on this epoxy resin, which may also include silicone, urethane, polyimide, or polyamide structures or the like. Furthermore, the resin skeleton may also include phosphorus atoms, sulfur atoms, nitrogen atoms or the like.

Specific examples of this type of epoxy resin include bisphenol A epoxy resins, bisphenol F epoxy resins, and hydrogenated products thereof; glycidyl ether-based epoxy resins such as phenol novolac epoxy resins and cresol novolac epoxy resins; glycidyl ester-based epoxy resins such as glycidyl hexahydrophthalate and dimer acid glycidyl ester; glycidyl amine-based epoxy resins such as triglycidyl isocyanurate and tetraglycidyldiaminodiphenylmethane; and linear aliphatic epoxy resins such as epoxidated polybutadiene and epoxidated soybean oil, and of these, bisphenol A epoxy resins, bisphenol F epoxy resins, phenol novolac epoxy resins, and cresol novolac epoxy resins are preferred. Examples of commercially available products of these resins include the brand names Epikote 828 (manufactured by Japan Epoxy Resins Co., Ltd.), Epiclon 830S (manufactured by Dainippon Ink and Chemicals, Incorporated), Epikote 517 (manufactured by Japan Epoxy Resins Co., Ltd.), and EOCN103S (manufactured by Nippon Kayaku Co., Ltd.).

Furthermore, the various phosphorus-containing epoxy resins produced by bonding phosphorus atoms to an epoxy resin using a reactive phosphorus compound can also be used effectively in forming halogen-free flame retardant adhesive compositions. Specific examples of compounds that can be used include the compounds obtained by reacting an aforementioned epoxy resin with either 9,10-dihydro-9-oxa-10-phosphaphenanthrene-10-oxide (brand name: HCA, manufactured by Sanko Co., Ltd.), or a compound in which the active hydrogen atom bonded to the phosphorus atom of this compound has been substituted with hydroquinone (brand name: HCA-HQ, manufactured by Sanko Co., Ltd.). Examples of commercially available products of these phosphorus-containing epoxy resins include the brand names FX305 (manufactured by Tohto Kasei Co., Ltd., phosphorus content: 3% by mass), and Epiclon EXA9710 (manufactured by Dainippon Ink and Chemicals, Incorporated, phosphorus content: 3% by mass). The above epoxy resins may be used either alone, or in combinations of two or more different resins.

[Carboxyl Group-containing Acrylic Resin and/or Carboxyl Group-containing Acrylonitrile-Butadiene Rubber (B)]

Either a carboxyl group-containing acrylic resin and/or a carboxyl group-containing acrylonitrile-butadiene rubber (hereafter, the term "acrylonitrile-butadiene rubber" is abbreviated as "NBR") can be used as the component (B).

There are no particular restrictions on the proportion of carboxyl groups within the carboxyl group-containing acrylic resin and/or a carboxyl group-containing NBR (in other words, the ratio of the monomers that contain a carboxyl group relative to the combined total of all the monomers that constitute the carboxyl group-containing acrylic resin or a carboxyl group-containing NBR), but this proportion is preferably within a range from 1 to 10 mol %, and is even more preferably from 2 to 6 mol %.

Examples of carboxyl group-containing acrylic resins that can be used in the present invention include resins with a glass transition temperature (Tg) within a range from –40 to 30° C., which contain an acrylate ester as the primary component, and also include a small quantity of a carboxyl group-containing monomer. This glass transition temperature (Tg) is preferably from −10 to 25° C. Provided the glass transition temperature is within a range from −40 to 30° C., the adhesive exhibits an appropriate level of tackiness, and also displays superior handling properties. If the glass transition temperature is lower than −40° C., then the tackiness of the adhesive is excessive, causing a deterioration in the handling properties. Furthermore, if the glass transition temperature exceeds 30° C., then the adhesive lacks adhesiveness. The glass transition temperature is measured using a differential scanning calorimeter (DSC).

The weight average molecular weight of the acrylic resin, measured by gel permeation chromatography (GPC, and referenced against polystyrene standards) is preferably within a range from 100,000 to 1,000,000, and is even more preferably from 300,000 to 850,000.

The acrylic polymer can be prepared using normal solution polymerization, emulsion polymerization, suspension polymerization, or bulk polymerization methods, although from the viewpoint of achieving maximum reduction in the quantity of ionic impurities which can have adverse effects on the anti-migration properties, acrylic resins prepared by suspension polymerization are preferred.

Preferred examples of this acrylic resin include acrylic polymers obtained by copolymerizing three components, namely (a) an acrylate ester and/or methacrylate ester, (b) acrylonitrile and/or methacrylonitrile, and (c) an unsaturated carboxylic acid. This acrylic polymer may be either a copolymer formed solely from the above three components (a) to (c), or a copolymer that also includes one or more other components.

(a) (Meth)acrylate Ester

The acrylate ester and/or methacrylate ester of the component (a) imparts flexibility to the acrylic adhesive composition, and specific examples of suitable (meth)acrylate ester compounds include methyl (meth)acrylate, ethyl (meth)acrylate, n-butyl (meth)acrylate, isobutyl (meth)acrylate, isopentyl (meth)acrylate, n-hexyl (meth)acrylate, isooctyl (meth)acrylate, 2-ethylhexyl (meth)acrylate, n-octyl (meth)acrylate, isononyl (meth)acrylate, n-decyl (meth)acrylate, and isodecyl (meth)acrylate. Of these, alkyl (meth)acrylate esters in which the alkyl group contains from 1 to 12 carbon atoms, and particularly from 1 to 4 carbon atoms, are preferred. These (meth)acrylate esters of the component (a) may be used either alone, or in combinations of two or more different compounds.

The quantity of the component (a) within the component (A) is preferably within a range from 50 to 80% by mass, and even more preferably from 55 to 75% by mass. If this quantity is less than 50% by mass, then the adhesive may lose flexibility. In contrast, if the quantity exceeds 80% by mass, then the resulting composition may suffer from exudation during press working.

(b) (Meth)acrylonitrile

The acrylonitrile and/or methacrylonitrile of the component (b) imparts heat resistance, adhesiveness and chemical resistance to the adhesive sheet.

The quantity of the component (b) within the component (A) is preferably within a range from 15 to 45% by mass, and even more preferably from 20 to 40% by mass. If this quantity is less than 15% by mass, then the adhesive may exhibit inferior heat resistance. In contrast, if the quantity exceeds 45% by mass, then the adhesive sheet may lose flexibility.

(c) Unsaturated Carboxylic Acid

The unsaturated carboxylic acid of the component (c) imparts adhesiveness, and also functions as a cross-linking point during heating. Any copolymerizable vinyl monomer that contains a carboxyl group may be used, and specific examples of suitable compounds include acrylic acid, methacrylic acid, crotonic acid, maleic acid, fumaric acid and itaconic acid.

The quantity of the component (c) within the component (A) is preferably within a range from 2 to 10% by mass, and even more preferably from 2 to 8% by mass. If this quantity is less than 2% by mass, then the cross-linking effect may be inadequate. In contrast, if the quantity exceeds 10% by mass, then excessive cross-linking within the composition may result in poor affinity of the adhesive sheet for the target adherend, which can cause foaming or blistering during heat curing treatment or solder bath treatment.

There are no particular restrictions on the proportion of carboxyl groups within the carboxyl group-containing acrylic resin (in other words, the ratio of the above monomer that contains a carboxyl group relative to the combined total of all the monomers that constitute the carboxyl group-containing acrylic resin), but this proportion is preferably within a range from 1 to 10 mol %, and is even more preferably from 2 to 6 mol %.

Specific examples of this type of carboxyl group-containing acrylic resin, listed as commercially available brand names, include Paracron ME-3500-DR (manufactured by Negami Chemical Industrial Co., Ltd., glass transition temperature: −35° C., weight average molecular weight: 600,000, contains —COOH groups), Teisan Resin WS023DR (manufactured by Nagase ChemteX Corporation, glass transition temperature: −5° C., weight average molecular weight: 450,000, contains —OH/—COOH groups), Teisan Resin SG-280DR (manufactured by Nagase ClemteX Corporation, glass transition temperature: −30° C., weight average molecular weight: 900,000, contains —COOH groups), and Teisan Resin SG-708-6DR (manufactured by Nagase ChemteX Corporation, glass transition temperature: 5° C., weight average molecular weight: 800,000, contains —OH/—COOH groups). These acrylic resins may be used either alone, or in combinations of two or more different resins.

Examples of carboxyl group-containing NBR rubbers that can be used in the present invention include rubbers produced by carboxylating the molecular chain terminals of a copolymer rubber prepared by a copolymerization of acrylonitrile and butadiene in which the quantity of acrylonitrile relative to the combined total of acrylonitrile and butadiene is preferably within a range from 5 to 70% by mass, and even more preferably from 10 to 50% by mass, and copolymer rubbers produced by a copolymerization of acrylonitrile, butadiene, and a carboxyl group-containing monomer such as acrylic acid or maleic acid. The above carboxylation can be conducted using a monomer that contains a carboxyl group, such as methacrylic acid.

There are no particular restrictions on the proportion of carboxyl groups within the carboxyl group-containing NBR (in other words, the ratio of the above monomer that contains a carboxyl group relative to the combined total of all the monomers that constitute the carboxyl group-containing NBR), but this proportion is preferably within a range from 1 to 10 mol %, and is even more preferably from 2 to 6 mol %. Provided this proportion satisfies this range from 1 to 10 mol %, the fluidity of the product composition can be controlled, meaning a favorable level of curability can be achieved.

Specific examples of these carboxyl group-containing NBR rubbers, listed in terms of their brand names, include Nipol 1072 (manufactured by Zeon Corporation), and the high-purity, low ionic impurity product PNR-1H (manufactured by JSR Corporation). High-purity carboxyl group-containing acrylonitrile butadiene rubbers are very expensive and can therefore not be used in large quantities, although they are effective in simultaneously improving the adhesion and the anti-migration properties.

There are no particular restrictions on the blend quantity of the component (B), although the quantity is typically within a range from 10 to 200 parts by mass, and preferably from 20 to 150 parts by mass, per 100 parts by mass of the component (A). Provided the quantity of the component (B) falls within this range from 10 to 200 parts by mass, the produced flexible copper-clad laminate, coverlay film, and adhesive sheet exhibit superior flame retardancy, and superior peel strength from the copper foil.

The above carboxyl group-containing acrylic resin and/or the carboxyl group-containing NBR can each be used either alone, or in combinations of two or more different materials.

[Curing Agent (C)]

There are no particular restrictions on the curing agent of the component (C), and any of the materials typically used as epoxy resin curing agents can be used. Examples of the curing agent include polyamine-based curing agents, acid anhydride-based curing agents, boron trifluoride amine complex salts, and phenol resins. Specific examples of polyamine-based curing agents include aliphatic amine-based curing agents such as diethylenetriamine, tetraethylenetetramine and tetraethylenepentamine, alicyclic amine-based curing agents such as isophorone diamine, aromatic amine-based curing agents such as diaminodiphenylmethane and phenylenediamine, and dicyandiamide. Specific examples of acid anhydride-based curing agents include phthalic anhydride, pyromellitic anhydride, trimellitic anhydride, and hexahydrophthalic anhydride. Of these, from the viewpoint of ensuring a suitable level of reactivity when the composition is used in a coverlay film, polyamine-based curing agents are preferred, whereas from the viewpoint of imparting a superior level of heat resistance when the composition is used in a flexible copper-clad laminate, acid anhydride-based curing agents are preferred. The curing agent of the component (C) may be used either alone, or in a combination of two or more different compounds.

There are no particular restrictions on the blend quantity of the component (C), although the quantity is typically within a range from 0.5 to 20 parts by mass, and preferably from 1 to 15 parts by mass, per 100 parts by mass of the component (A).

[Curing Accelerator (D)]

In the present invention, the component (D) is not an essential component, but is preferably added to the composition. There are no particular restrictions on the curing accelerator of the component (D), provided it accelerates the reaction between the halogen-free epoxy resin (A) and the curing agent (C), and contains no halogen atoms. Specific examples of this curing accelerator include imidazole compounds such as 2-methylimidazole, 2-ethylimidazole, 2-ethyl-4-methylimidazole, ethyl isocyanate compounds of these compounds, 2-phenylimidazole, 2-phenyl-4-methyl imidazole, 2-phenyl-4-methyl-5-hydroxymethylimidazole, and 2-phenyl-4,5-dihydroxymethylimidazole; triorganophosphine compounds such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts; tertiary amines such as triethyleneammonium triphenylborate, and the tetraphenylborate thereof; and octylatee salts such as tin octylate and zinc octylate. These curing accelerators may be used either alone, or in combinations of two or more different compounds.

There are no particular restrictions on the blend quantity of the component (D), although the quantity is typically within a range from 0.1 to 15 parts by mass, preferably from 0.5 to 10 parts by mass, and even more preferably from 1 to 5 parts by mass, per 100 parts by mass of the component (A).

[Phosphinate (E) Represented by the General Formula (1) or the General Formula (2)]

The phosphinate represented by the above general formula (1) and/or the diphosphinate represented by the above general formula (2) (hereafter jointly referred to as "phosphinates") contain no halogen atoms, and are used for imparting flame retardancy to the composition.

Of the phosphinates described above, the groups $R_1$ and $R_2$ within the compounds represented by the general formula (1) and the general formula (2) are preferably alkyl groups of 1 to 3 carbon atoms, and ethyl groups are particularly preferred, whereas M preferably represents aluminum. The group $R_3$ within the compounds represented by the general formula (2) is preferably alkyl group of 1 to 3 carbon atoms, more preferably ethyl group.

The phosphinates have a high phosphorus content, enabling a particularly high level of flame retardancy to be achieved. Furthermore, the above phosphinates are insoluble in the organic solvents such as methyl ethyl ketone, toluene and dimethylacetamide typically used in adhesive varnishes, and are also insoluble in the epoxy resin component, meaning that when used within coverlay film, these phoshinates offer the advantage of being resistant to exudation during heat press curing of the coverlay film. The average particle size of the above phosphinates used in the present invention is preferably not more than 20 μm, and is even more preferably at least 0.1 μm but not more than 10 μm. If the average particle size of the phosphinate is either too large or too small, then the dispersibility of the phosphinate within the composition of the present invention deteriorates, which can lead to problems in terms of the flame retardancy, heat resistance and the insulating properties. An example of a commercially available product of the above phosphinates is the product Exolit OP930 (manufactured by Clariant Ltd., aluminum diethylphosphinate, phosphorus content: 23% by mass). In this description, the term "average particle size" refers to the volume-average particle size measured using a laser diffraction scattering method.

Other phosphorus-based flame retardants may also be used in combination with the above phosphinates, provided addition of these other retardants does not impair the anti-migration properties. However, the phosphinates are preferably used alone, and the combined use of phosphate esters is particularly undesirable, as these esters cause a significant deterioration in the anti-migration properties.

There are no particular restrictions on the blend quantity of the component (E), although in order to ensure a favorable level of flame retardancy, the phosphorus content, relative to the organic resin component within the adhesive composition (excluding the inorganic solid components), is preferably within a range from 2.0 to 4.5% by mass, and is even more preferably from 2.5 to 4.0% by mass. If this ratio is less than 2.0% by mass, then ensuring the desired level of flame retardancy for the adhesive composition is difficult, whereas if the ratio exceeds 4.5% by mass, the heat resistance of the adhesive composition tends to worsen. To provide a more specific description of the inorganic solid components and the organic resin components within the adhesive composition, the inorganic solid components include the ion scavenger (F) and the inorganic fillers described below. The organic resin components include, for example, the halogen-free epoxy resin (A), the carboxyl group-containing acrylic resin and/or carboxyl group-containing acrylonitrile-butadiene rubber (B), the curing agent (C), the curing accelerator (D), the phosphinates (E) represented by the general formula (1) and the general formula (2), and the heavy metal deactivator (F).

[Ion Scavenger and/or Heavy Metal Deactivator (F)]

The ion scavenger and/or heavy metal deactivator of the component (F) further improves the anti-migration properties.

An ion scavenger refers to a compound with an ion trapping function, and is used to reduce the quantity of ionic impurities by trapping phosphate anions, organic acid anions, halogen anions, alkali metal cations, alkaline earth metal cations and the like. If the composition contains a large quantity of ionic impurities, then wire corrosion can become a problem, and the anti-migration properties of the insulating layer tend to deteriorate markedly. Specific examples of this type of ion scavenger include hydrotalcite-based ion scavengers, bismuth oxide-based ion scavengers, antimony oxide-based ion scavengers, titanium phosphate-based ion scavengers, and zirconium phosphate-based ion scavengers. Examples of suitable commercially available ion scavengers include the products DHT-4A (a hydrotalcite-based ion scavenger, manufactured by Kyowa Chemical Industry Co., Ltd.), IXE-100 (a zirconium phosphate-based ion scavenger, manufactured by Toagosei Co., Ltd.), IXE-300 (an antimony oxide-based ion scavenger, manufactured by Toagosei Co., Ltd.), IXE-400 (a titanium phosphate-based ion scavenger, manufactured by Toagosei Co., Ltd.), IXE-500 (a bismuth oxide-based ion scavenger, manufactured by Toagosei Co., Ltd.), and IXE-600 (an antimony oxide-bismuth oxide-based ion scavenger, manufactured by Toagosei Co., Ltd.).

Furthermore, the heavy metal deactivator inhibits the elution of copper ions and improves the anti-migration properties by deactivating the surface of the copper wiring of the flexible printed wiring board. Specific examples of this type of heavy metal deactivator include nitrogen compounds such as hydrazides and triazoles. Examples of suitable commercially available heavy metal deactivators include Irganox MD1024 (a hydrazide-based heavy metal deactivator, manufactured by Ciba Specialty Chemicals Inc.) and BT-120 (a benzotriazole-based heavy metal deactivator, manufactured by Johoku Chemical Co., Ltd.).

The ion scavengers and heavy metal deactivators described above may be used either alone, or in combinations of two or more different materials.

There are no particular restrictions on the blend quantity of the component (F), although the quantity is typically within a range from 0.1 to 5 parts by mass, and preferably from 0.5 to 3 parts by mass, per 100 parts by mass of the component (A).

[Other Optional Components]

In addition to the components (A) through (F) described above, other optional components may also be added, provided they do not impair the objects or effects of the present invention.

Inorganic Fillers

Inorganic fillers other than the phosphinates of the component (E) may be added. There are no particular restrictions on these inorganic fillers, and any fillers used in conventional adhesive sheets, coverlay films, and flexible copper-clad laminates can be used. Specifically, from the viewpoint of also functioning as a flame retardancy assistant, metal oxides such as aluminum hydroxide, magnesium hydroxide, silicon dioxide and molybdenum oxide can be used, and of these, aluminum hydroxide and magnesium hydroxide are preferred. These inorganic fillers may be used either alone, or in combinations of two or more different compounds. There are no particular restrictions on the blend quantity of the above inorganic filler, although the quantity is preferably within a range from 5 to 50 parts by mass, and even more preferably from 10 to 40 parts by mass, per 100 parts by mass of the combination of the organic resin components within the adhesive composition.

Organic Solvents

The components (A) to (F) described above, and any optional components that are added as required, may be used in a solventless form in the production of flexible copper-clad laminates, coverlay films and adhesive sheets, or may be dissolved or dispersed in an organic solvent to form a solution or dispersion of the composition (hereafter simply referred to as a "solution"). Examples of suitable organic solvents include N,N-dimethylacetamide, methyl ethyl ketone, N,N-dimethylformamide, cyclohexanone, N-methyl-2-pyrrolidone, toluene, methanol, ethanol, isopropanol and acetone. Of these, N,N-dimethylacetamide, methyl ethyl ketone, N,N-dimethylformamide, cyclohexanone, N-methyl-2-pyrrolidone and toluene are preferred, and N,N-dimethylacetamide, methyl ethyl ketone and toluene are particularly preferred. These organic solvents may be used either alone, or in combinations of two or more different solvents.

The combined concentration of the organic resin components and the inorganic solid components within the above adhesive solution is typically within a range from 10 to 45% by mass, and is preferably from 20 to 40% by mass. Provided this concentration falls within this range from 10 to 45% by mass, the adhesive solution exhibits favorable ease of application to substrates such as electrically insulating films, thus providing superior workability. Moreover, the adhesive solution also offers superior coating properties, with no irregularities occurring during coating, while also providing superior performance in terms of environmental and economic factors.

The term "organic resin components" refers to the non-volatile organic components that constitute the cured product obtained by curing the adhesive composition of the present invention. Specifically, the organic resin components include mainly the components (A) to (E), the heavy metal deactivator of the component (F), and any other optional organic components. In those cases where the adhesive composition includes an organic solvent, the organic solvent is not usually included within these organic resin components. Furthermore, the term "inorganic solid components" refers to the non-volatile inorganic solid components included within the adhesive composition of the present invention, and specific examples include the ion scavenger of the component (F), any optional inorganic fillers, and any other optional inorganic components that may be added.

The organic resin components within the composition of the present invention, together with any added inorganic solid components and organic solvents, can be mixed together using a pot mill, ball mill, homogenizer, super mill or the like.

<Coverlay Films>

The composition described above can be used in the production of coverlay films. Specifically, coverlay films having an electrically insulating film, and a layer comprising the above adhesive composition provided on at least one surface of the film can be produced. The coverlay film may also include an optional protective layer, which is provided on top of the layer of the adhesive composition in order to protect the adhesive composition layer. Furthermore, in those cases where the electrically insulating film is very thin, a support layer may be bonded to the electrically insulating film to reinforce the film.

As follows is a description of a process for producing such a coverlay film.

An adhesive solution prepared in a liquid form by mixing the required components with an organic solvent is applied to an electrically insulating film using a reverse roll coater, a comma coater or the like. The electrically insulating film with the applied adhesive solution is then passed through an in-line dryer, and heated at 80 to 160° C. for a period of 2 to 10 minutes, thereby removing the organic solvent and drying the adhesive composition to form a semi-cured state. A roll laminator is then used to crimp and laminate the semi-cured layer of the adhesive composition to a releasable base material that functions as a protective layer, thereby forming a coverlay film. The releasable base material is peeled off at the time of use. The term "semi-cured state" refers to a state where the composition is dry, and the curing reaction has begun within portions of the composition.

The dried thickness of the adhesive composition layer in the above coverlay film is typically within a range from 5 to 45 μm, and is preferably from 5 to 35 μm.

Electrically Insulating Film

The above electrically insulating film is also used in flexible copper-clad laminates of the present invention. There are no particular restrictions on the electrically insulating film, and any film that is typically used in flexible copper-clad laminates or coverlay films can be used. Specific examples of suitable electrically insulating films include polyimide films, aramid films, polyethylene terephthalate films, polyethylene naphthalate films, polyester films, polyparabanic acid films, polyether ether ketone films and polyphenylene sulfide films, as well as films produced by impregnating a base comprising glass fiber, aramid fiber, polyester fiber or the like with a matrix such as an epoxy resin or acrylic resin, subsequently forming the impregnated base into a film or sheet form, and then bonding the film or sheet to copper foil. From the viewpoints of achieving favorable heat resistance, dimensional stability and mechanical properties for the produced coverlay film, the use of low temperature plasma-treated polyimide films and corona-treated aramid films is particularly desirable. Any of the polyimide films typically used in coverlay films can be used. The thickness of this electrically insulating film can be set to any desired value depending on need, although thickness values from 9 to 50 μm are preferred. Furthermore, any of the aramid films typically used in coverlay films can be used, and although the thickness of this aramid film can be set to any desired value depending on need, thickness values from 3 to 9 μm are preferred. Aramid films generally have a higher modulus of elongation than polyimide films, and consequently can be handled in the form of very thin films. However, in those cases where handling of a thin film is difficult, the handling properties can be improved by bonding a support film such as a polyethylene terephthalate film that has been coated with a pressure-sensitive adhesive to the thin film.

Accordingly, in a representative example of a coverlay film in which an aramid film is used as the electrically insulating film, the coverlay film comprises an electrically insulating film comprising a support film and an aramid film with a thickness of 3 to 9 μm supported on the support film, a layer comprising the above adhesive composition provided on at least one surface of the insulating film, and a releasable base material provided on top of the adhesive composition layer.

Releasable Base Material (Protective Layer)

There are no particular restrictions on the releasable base material described above, provided it is a film material that protects the adhesive composition layer, and if required, is able to be peeled off from the adhesive composition layer without damaging the state of the adhesive layer. Examples of suitable films include plastic films such as polyethylene (PE) films, polypropylene (PP) films, polymethylpentene (TPX) films, and release-treated polyester films; and release sheets in which a polyolefin film such as a PE film or PP film, a TPX film, or a release-treated polyester film is coated onto one side or both sides of a paper material. There are no particular restrictions on the thickness of the releasable base material, although the thickness is typically within a range from 25 to 150 μm, and preferably from 30 to 140 μm.

<Adhesive Sheets>

The composition described above can be used in the production of adhesive sheets. Specifically, adhesive sheets having a layer comprising the above composition, and a releasable base material that functions as a protective layer, which covers the layer comprising the composition and is provided on at least one surface of the adhesive layer, can be produced. This releasable base material can use the same materials as those described above in the section relating to the protective layer for a coverlay film. The dried thickness of the adhesive layer in the above adhesive sheet is typically within a range from 5 to 50 μm, and is preferably from 10 to 40 μm. The thickness of the releasable base material layer is typically within a range from 25 to 150 μm, and is preferably from 30 to 140 μm.

As follows is a description of a process for producing an adhesive sheet of the present invention.

An adhesive composition of the present invention, prepared in a solution form by mixing the required components with an organic solvent, is applied to a releasable base material using a reverse roll coater, a comma coater or the like. The releasable base material with the applied adhesive solution is then passed through an in-line dryer, and heated at 80 to 160° C. for a period of 2 to 10 minutes, thereby removing the organic solvent and drying the adhesive composition to form a semi-cured state. A roll laminator is then used to crimp and laminate the semi-cured adhesive composition layer to another releasable base material, thereby forming an adhesive sheet.

<Flexible Copper-clad Laminates>

The composition of the present invention can be used in the production of flexible copper-clad laminates. Specifically, flexible copper-clad laminates having an electrically insulating film, a layer comprising the above adhesive composition provided on either one surface or both surfaces of the electrically insulating film, and one or two layers of copper foil bonded to the one or two layers of the composition can be produced. The electrically insulating film can use the same electrically insulating films as those described above in the section relating to coverlay films. As follows is a description of a process for producing a flexible copper-clad laminate.

An adhesive composition of the present invention, prepared in a solution form by mixing the required components with an organic solvent, is applied to an electrically insulating film using a reverse roll coater, a comma coater or the like.

The electrically insulating film with the applied adhesive solution is then passed through an in-line dryer, and heated at 80 to 160° C. for a period of 2 to 10 minutes, thereby removing the organic solvent and drying the composition to form a semi-cured state. A copper foil is then placed on top of the semi-cured adhesive composition layer, and heat lamination (thermocompression bonding) at a temperature from 100 to 150° C. is effected to form a laminate. By subjecting this laminate to post-curing at 80 to 160° C., the semi-cured composition is completely cured, yielding the final flexible copper-clad laminate.

The dried thickness of the adhesive composition layer in the above flexible copper-clad laminate is typically within a range from 5 to 45 μm, and is preferably from 5 to 18 μm.

The copper foil described above can use the rolled copper foil or electrolytic copper foil typically used in conventional flexible copper-clad laminates. The thickness of this copper foil is typically within a range from 3 to 70 μm.

EXAMPLES

As follows is a more detailed description of the present invention using a series of examples, although the present invention is in no way limited by the examples presented below. The components (A) through (F), and the other optional components used in the examples are as specified below. The units for the numbers representing the blend proportions in the tables are "parts by mass".

<Adhesive Composition Components>
 (A) Halogen-Free Epoxy Resin
 (1) Epikote 828 (brand name) (manufactured by Japan Epoxy Resins Co., Ltd., epoxy equivalent weight: 184 to 194)
 (2) Epikote 1001 (brand name) (manufactured by Japan Epoxy Resins Co., Ltd., epoxy equivalent weight: 450 to 500)
 (3) EOCN-103S (brand name) (manufactured by Nippon Kayaku Co., Ltd., epoxy equivalent weight: 209 to 219)
 (4) NC-3000-H (brand name) (manufactured by Nippon Kayaku Co., Ltd., epoxy equivalent weight: 280 to 300)
 (5) EP-49-20 (brand name) (manufactured by Asahi Denka Co., Ltd., epoxy equivalent weight: 200)
 (B) Carboxyl Group-containing Acrylic Resin and/or Carboxyl Group-containing Acrylonitrile-Butadiene Rubber
 (1) Nipol 1072 (brand name) (a carboxyl group-containing NBR, manufactured by Zeon Corporation)
 (2) Teisan Resin SG-708-6DR (a carboxyl group-containing acrylic resin, manufactured by Nagase ChemteX Corporation)
 (C) Curing Agents
 (1) 4,4'-diaminodiphenylsulfone (DDS, a diamine-based curing agent)
 (2) Phenolite TD-2093 (brand name) (a novolac-type phenol resin, manufactured by Dainippon Ink and Chemicals Inc., OH equivalent weight: 104)
 (D) Curing Accelerator
 (1) 2E4MZ (brand name) (an imidazole-based curing accelerator, manufactured by Shikoku Chemical Corporation)
 (E) Phosphinate Compound
 (1) Exolit OP930 (brand name) (aluminum diethylphosphinate, manufactured by Clariant Ltd., phosphorus content: 23% by mass)
 (F) Ion Scavenger, Heavy Metal Deactivator
 (1) DHT-4A (brand name) (a magnesium-aluminum hydroxide-carbonate-hydrate ($Mg_{4.3}Al_2(OH)_{12.6}CO_3 \cdot mH_2O$), an ion scavenger manufactured by Kyowa Chemical Industry Co., Ltd.)
 (2) BT-120 (brand name) (1,2,3-benzotriazole, a heavy metal deactivator manufactured by Johoku Chemical Co., Ltd.).

Inorganic Filler
 (1) Aluminum hydroxide
   Other Phosphorus-based Flame Retardants PX-200 (brand name) (an aromatic condensed phosphate ester, manufactured by Daihachi Chemical Industry Co., Ltd., phosphorus content: 9.0% by mass)

SP-703 (brand name) (an aromatic phosphate esteramide, manufactured by Shikoku Chemical Corporation, phosphorus content: 10% by mass)

SPE-100 (brand name) (phosphazene, manufactured by Otsuka Chemical Co., Ltd., phosphorus content: 13% by mass)

<Properties of Flexible Copper-clad Laminates and Coverlay Films>

Example 1

Preparation of Adhesive Composition

The adhesive composition components were combined in the proportions shown in the column labeled "blend example 1" in Table 1, and a mixed solvent of methyl ethyl ketone and toluene with a mass ratio of 1/1 was then added to the resulting mixture, yielding a dispersion in which the combined concentration of the organic solid components and the inorganic solid components was 35% by mass.

Preparation of Flexible Copper-clad Laminate

The above dispersion was then applied to the surface of a polyimide film A (brand name: Kapton, manufactured by DuPont Toray Co., Ltd., thickness: 25 μm) using an applicator, in sufficient quantity to generate a dried coating of the adhesive composition with a thickness of 18 μm, and the applied coating was then dried for 10 minutes at 120° C. in a forced air oven, thereby converting the composition to a semi-cured state. The dispersion-coated surface of the polyimide film A and a roughened surface of a rolled copper foil (manufactured by Nippon Mining & Metals Co., Ltd., thickness: 18 μm) were then bonded together by thermocompression bonding using a roll laminator at 120° C. and a linear pressure of 20 N/cm, and the resulting laminate was then subjected to post-curing for one hour at 80° C., and a further 4 hours at 160° C., thereby completing the preparation of a flexible copper-clad laminate.

Preparation of Coverlay Film

The above dispersion was applied to the surface of a polyimide film A (brand name: Kapton, manufactured by DuPont Toray Co., Ltd., thickness: 25 μm) using an applicator, in sufficient quantity to generate a dried coating of the above adhesive composition with a thickness of 25 μm, and the applied coating was then dried for 10 minutes at 120° C. in a forced air oven, thereby converting the composition to a semi-cured state, and completing preparation of a coverlay film.

Example 2

With the exception of combining the adhesive composition components in the proportions shown in the column labeled "blend example 2" in Table 1, a flexible copper-clad laminate and a coverlay film were prepared in the same manner as the example 1.

Example 3

With the exception of combining the adhesive composition components in the proportions shown in the column labeled "blend example 3" in Table 1, a flexible copper-clad laminate and a coverlay film were prepared in the same manner as the example 1.

Example 4

Preparation of Flexible Copper-clad Laminate

A mixture produced by combining each of the adhesive composition components in the proportions shown in the column labeled "blend example 1" in Table 1 was dispersed in the mixed solvent used in the example 1 and the resulting dispersion in which the combined concentration of the organic solid components and the inorganic solid components was 35% by mass was applied to the surface of an aramid film (brand name: Aramica, manufactured by Teijin Advanced Film Co., Ltd., thickness: 4 μm) using an applicator, in sufficient quantity to generate a dried coating of the composition with a thickness of 10 μm, and the applied coating was then dried for 10 minutes at 120° C. in a forced air oven, thereby converting the composition to a semi-cured state. The dispersion-coated surface of the aramid film and a roughened surface of an electrolytic copper foil (manufactured by Mitsui Mining & Smelting Co., Ltd., thickness: 9 μm) were then bonded together by thermocompression bonding using a roll laminator at 120° C. and a linear pressure of 20 N/cm, and the resulting laminate was then subjected to post-curing for one hour at 80° C., and a further 4 hours at 160° C., thereby completing the preparation of a flexible copper-clad laminate.

Preparation of Coverlay Film

The above adhesive dispersion was applied to the surface of an aramid film (brand name: Aramica, manufactured by Teijin Advanced Film Co., Ltd., thickness: 4 μm) using an applicator, in sufficient quantity to generate a dried coating of the composition with a thickness of 10 μm, and the applied coating was then dried for 10 minutes at 120° C. in a forced air oven, thereby converting the composition to a semi-cured state, and completing preparation of a coverlay film.

Comparative Examples 1 to 9

With the exception of combining the adhesive composition components in the proportions shown in the columns labeled comparative blend examples 1 to 9 in Table 1, flexible copper-clad laminates and coverlay films were prepared in the same manner as the example 1.

Comparative Example 10

With the exception of combining the adhesive composition components in the proportions shown in the column labeled "comparative blend example 2" in Table 1, a flexible copper-clad laminate and a coverlay film were prepared in the same manner as the example 4.

[Measurements]

The properties of the flexible copper-clad laminates prepared in the examples 1 to 4 and the comparative examples 1 to 10 were measured in accordance with the measurement methods 1 described below. The properties of the prepared coverlay films were measured in accordance with the measurement methods 2 described below. Furthermore, the anti-migration properties of the flexible copper-clad laminates and the coverlay films were measured in accordance with the measurement method 3 described below. The results of the measurements are shown in Table 2.

—Measurement Methods 1—

1-1. Peel Strength

The peel strength was measured in accordance with JIS C6471, by forming a circuit with a pattern width of 1 mm on the flexible copper-clad laminate, and then measuring the minimum value for the force required to peel the copper foil (the circuit) at a speed of 50 mm/minute in a direction at an angle of 90 degrees to the surface of the laminate under conditions at 25° C. This measured value was reported as the peel strength. However, for those laminates in which an aramid film was used as the electrically insulating film (the example 4 and the comparative example 10), the minimum value for the force required to peel the copper foil at a speed of 50 mm/minute in a direction at an angle of 180 degrees to the surface of the laminate was measured and reported as the peel strength.

1-2. Solder Heat Resistance (Normal Conditions, Moisture Absorption)

Normal conditions: The solder heat resistance was measured in accordance with JIS C6471, by preparing test specimens by cutting the flexible copper-clad laminate into 25 mm squares, and then floating these test specimens for 30 seconds on a 300° C. solder bath. If the test specimens exhibited no blistering, peeling or discoloration, then the solder heat resistance was evaluated as "good", and was recorded using the symbol ○, whereas if the test specimens exhibited at least one of blistering, peeling or discoloration, then the solder heat resistance was evaluated as "poor", and was recorded using the symbol x.

Moisture absorption: Test specimens prepared in the same manner as those prepared for the aforementioned measurement of the solder heat resistance under normal conditions were left to stand for 24 hours in an atmosphere at a temperature of 40° C. and a relative humidity of 90%, and the test specimens were then floated for 30 seconds on a 260° C. solder bath. If the test specimens exhibited no blistering, peeling or discoloration, then the solder heat resistance was evaluated as "good", and was recorded using the symbol ○, whereas if the test specimens exhibited at least one of blistering, peeling or discoloration, then the solder heat resistance was evaluated as "poor", and was recorded using the symbol x.

1-3. Flame Retardancy

A sample was first prepared by removing the entire copper foil from the flexible copper-clad laminate using an etching treatment. The flame retardancy of this sample was then measured in accordance with the flame retardancy standard UL94VTM-0. If the sample satisfied the UL94VTM-0 standard it was evaluated as "good", and was recorded using the symbol ○, whereas if the sample did not satisfy the UL94VTM-0 standard, it was evaluated as "poor", and was recorded using the symbol x.

—Measurement Methods 2—

2-1. Peel Strength

The peel strength was measured in accordance with JIS C6471, by first preparing a pressed sample by bonding the adhesive layer of the coverlay film to the glossy surface of a rolled copper foil (manufactured by Nippon Mining & Metals Co., Ltd., thickness: 18 μm) using a press device (temperature: 160° C., pressure: 3 MPa, time: 30 minutes). The prepared pressed sample was then cut to form a test specimen with a width of 1 cm and a length of 15 cm. The surface of the electrically insulating film of this test specimen was secured (in the case of an aramid film, the film is very thin and prone to rupture, and is consequently reinforced by bonding a mending tape to the rear surface of the film), and the minimum value for the force required to peel the copper foil at a speed of 50 mm/minute in a direction at an angle of 90 degrees to the surface of the electrically insulating film under conditions at 25° C. was then measured, and this measured value was reported as the peel strength.

2-2. Solder Heat Resistance (Normal Conditions, Moisture Absorption)

With the exception of preparing the test specimens by cutting 25 mm square samples from a pressed sample of the coverlay film, which was prepared in the same manner as that described above for the measurement of the peel strength, the solder heat resistance was measured under normal conditions and under conditions of moisture absorption in the same manner as that described in the above measurement method 1-2.

2-3. Flame Retardancy

A sample was first prepared by removing the entire copper foil from an aforementioned pressed sample using an etching treatment. The flame retardancy of this sample was then measured in accordance with the flame retardancy standard L94VTM-0. If the sample satisfied the UL94VTM-0 standard it was evaluated as "good", and was recorded using the symbol ○, whereas if the sample did not satisfy the UL94VTM-0 standard, it was evaluated as "poor", and was recorded using the symbol x.

—Measurement Methods 3—

3-1. Anti-migration Properties (Evaluation of Single Layer Structures and Multilayer Structures)

Using the flexible copper-clad laminates and coverlay films from each of the examples, as well as adhesive sheets having an adhesive composition layer (25 μm) on one surface of a polyester film, prepared in the same manner as the example 5 described below but with the exception of using the adhesive dispersions from each of the examples, test specimens with a single layer structure and test specimens with a multilayer structure were prepared. A more detailed description is provided below.

Test Specimen for Evaluating Single Layer Structure

A test specimen for evaluating a single layer structure with the cross-sectional structure shown in FIG. 1 was prepared. A comb-shaped circuit in which the ratio of line width/space width=80 μm/80 μm was formed on the flexible copper-clad laminate, and the coverlay film was then bonded to the circuit-bearing surface using a press device, under conditions including a temperature of 160° C., a pressure of 3 MPa and a compression time of 30 minutes, thereby forming a test specimen for evaluating a single layer structure. In FIG. 1, numeral 1 represents an electrically insulating film originating from the coverlay film, numeral 2 represents an adhesive layer originating from the coverlay film, numeral 3 represents an adhesive layer originating from the flexible copper-clad laminate, numeral 4 represents an electrically insulating film originating from the flexible copper-clad laminate, and numeral 5 represents a conductor (the copper circuit).

Test Specimen for Evaluating Multilayer Structure

Figure 2:
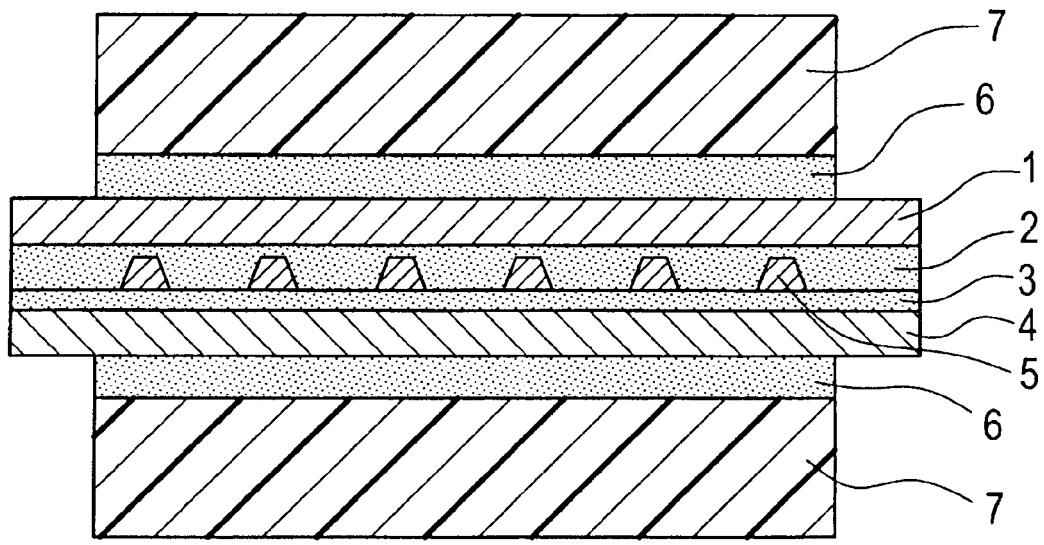
FIG. 2 is a longitudinal cross-sectional view showing an outline of the cross-sectional structure of a test specimen used for evaluating the anti-migration properties of a multilayer structure.

A test specimen for evaluating a multilayer structure with the cross-sectional structure shown in FIG. 2 was prepared. The adhesive layers of two separate adhesive sheets were bonded to the upper and lower surfaces respectively of a single layer evaluation test specimen prepared in the manner described above, and the polyester films that function as the protective layers were then peeled off the adhesive sheets to expose the underlying adhesive layers. Two glass epoxy sheets (thickness: 1 mm) were then bonded to the adhesive layers provided on the upper and lower surfaces of the single layer evaluation test specimen, thereby sandwiching the test specimen between the two glass epoxy sheets, and thermo-compression bonding was then conducted for 30 minutes under conditions including a temperature of 160° C. and a pressure of 3 MPa, thus forming a test specimen for evaluating a multilayer structure. In FIG. 2, numerals 1 to 5 are as defined for FIG. 1, numeral 6 represents an adhesive layer originating from an adhesive sheet, and numeral 7 represents a glass epoxy sheet.

Under conditions including a temperature of 85° C. and a relative humidity of 85%, the anti-migration properties of each of the prepared test specimens was measured by applying a direct current voltage of 50 V across the terminals of the test specimen (using a migration tester MIG-86, manufactured by IMV Corporation). The voltage was applied for 1,000 hours, and those specimens in which a short circuit occurred (indicated by a reduction in the resistance) within the conductor 5 prior to the completion of the 1,000 hours, and those specimens in which dendrite growth was detected after 1,000 hours were evaluated as "poor" and were recorded using the symbol x, whereas those specimens for which the resistance value was maintained even after 1,000 hours, and in which no dendrites were detected were evaluated as "good", and were recorded using the symbol ○.

TABLE 1

| | | | Blend Example | | | Comparative Blend Example | | | | | | | | |
|---|---|---|---|---|---|---|---|---|---|---|---|---|---|---|
| | Component | | 1 | 2 | 3 | 1 | 2 | 3 | 4 | 5 | 6 | 7 | 8 | 9 |
| A | Halogen-free epoxy resin | Epikote 828 | 40 | | 40 | 40 | 40 | 40 | 40 | 40 | 40 | 40 | | |
| | | Epikote 1001 | | 25 | | | | | | | | | 25 | 25 |
| | | EOCN-103S | 40 | 25 | 40 | 40 | 40 | 40 | 40 | 40 | 40 | 40 | 25 | 25 |
| | | NC-3000-H | | 50 | | | | | | | | | 50 | 50 |
| | | EP-49-20 | 20 | | 20 | 20 | 20 | 20 | 20 | 20 | 20 | 20 | | |
| B | NBR | Nipol 1072 | | 40 | 20 | | | | | | | | 40 | 40 |
| | Acrylic resin | SG-708-6DR | 100 | | 40 | 100 | 100 | 100 | 100 | 100 | 100 | 100 | | |
| C | Curing agent | DDS | 10 | | 10 | 10 | 10 | 10 | 10 | 10 | 10 | 10 | | |
| | | TD-2093 | | 10 | | | | | | | | | 10 | 10 |
| D | Curing accelerator | 2E4MZ | 1 | 1 | 1 | 1 | 1 | 1 | 1 | 1 | 1 | 1 | 1 | 1 |
| E | Phosphinate | OP930 | 40 | 30 | 35 | 40 | | | | | | | | |
| F | Ion scavenger | DHT-4A | 1 | | 1 | | 1 | 1 | | 1 | 1 | 1 | | |
| | Heavy metal deactivator | BT-120 | | 1 | | | | | | | | | 1 | 1 |
| Optional component: | Inorganic filler | Aluminum hydroxide | 20 | 25 | 20 | 20 | 20 | 20 | 20 | 20 | 20 | 20 | 25 | 25 |
| Other | Phosphate ester | PX-200 | | | | | 40 | 85 | 85 | | | | 30 | 60 |
| | Phosphate esteramide | SP-703 | | | | | | | | 75 | | | | |
| | Phosphazene | SPE-100 | | | | | | | | | 40 | 60 | | |
| Phosphorus content within adhesive composition (%) (excluding inorganic solid components) | | | 3.7% | 3.8% | 3.9% | 3.7% | 1.4% | 2.6% | 2.6% | 2.6% | 2.1% | 2.9% | 1.5% | 2.5% |

TABLE 2

| Measurement Item | Example 1 | Example 2 | Example 3 | Example 4 | Comparative Example 1 | Comparative Example 2 | Comparative Example 3 | Comparative Example 4 |
|---|---|---|---|---|---|---|---|---|
| Adhesive composition | Blend example 1 | Blend example 2 | Blend example 3 | Blend example 1 | Comparative example 1 | Comparative example 2 | Comparative example 3 | Comparative example 4 |
| Electrically insulating film (Polyimide: PI, aramid: AR) | PI | PI | PI | AR | PI | PI | PI | PI |
| Evaluation of copper-clad laminate | | | | | | | | |
| Peel strength (N/cm) | 12.3 | 9.4 | 9.2 | 9.0 | 12.3 | 5.0 | 4.2 | 4.2 |
| Solder heat resistance (° C.) | | | | | | | | |
| Normal conditions 300° C. | ○ | ○ | ○ | ○ | ○ | ○ | ○ | ○ |
| Moisture absorption 260° C. | ○ | ○ | ○ | ○ | ○ | ○ | ○ | ○ |
| Flame retardancy (UL94, VTM-0) | ○ | ○ | ○ | ○ | ○ | x | ○ | ○ |
| Anti-migration properties | | | | | | | | |
| Evaluation of single layer structure | ○ | ○ | ○ | ○ | ○ | x | x | x |
| Evaluation of multilayer structure | ○ | ○ | ○ | ○ | x | x | x | x |
| Evaluation of coverlay film | | | | | | | | |
| Peel strength (N/cm) | 9.3 | 9.1 | 8.8 | 8.4 | 9.3 | 5.2 | 4.0 | 4.0 |
| Solder heat resistance (° C.) | | | | | | | | |
| Normal conditions 300° C. | ○ | ○ | ○ | ○ | ○ | ○ | ○ | ○ |
| Moisture absorption 260° C. | ○ | ○ | ○ | ○ | ○ | ○ | ○ | ○ |
| Flame retardancy (UL94, VTM-0) | ○ | ○ | ○ | ○ | ○ | x | ○ | ○ |
| Anti-migration properties | | | | | | | | |
| Evaluation of single layer structure | ○ | ○ | ○ | ○ | ○ | x | x | x |
| Evaluation of multilayer structure | ○ | ○ | ○ | ○ | x | x | x | x |

| Measurement Item | 5 | 6 | 7 | 8 | 9 | 10 |
|---|---|---|---|---|---|---|
| Adhesive composition | Comparative example 5 | Comparative example 6 | Comparative example 7 | Comparative example 8 | Comparative example 9 | Comparative example 2 |
| Electrically insulating film (Polyimide: PI, aramid: AR) | PI | PI | PI | PI | PI | AR |
| Evaluation of copper-clad laminate | | | | | | |
| Peel strength (N/cm) | 6.1 | 5.5 | 4.2 | 3.6 | 3.0 | 1.5 |
| Solder heat resistance (° C.) | | | | | | |
| Normal conditions 300° C. | ○ | ○ | ○ | ○ | ○ | ○ |
| Moisture absorption 260° C. | x | ○ | ○ | ○ | ○ | ○ |
| Flame retardancy (UL94, VTM-0) | ○ | x | ○ | x | ○ | ○ |
| Anti-migration properties | | | | | | |
| Evaluation of single layer structure | x | ○ | ○ | x | x | x |
| Evaluation of multilayer structure | x | x | x | x | x | x |
| Evaluation of coverlay film | | | | | | |
| Peel strength (N/cm) | 6.0 | 5.3 | 4.1 | 3.6 | 2.8 | 1.5 |
| Solder heat resistance (° C.) | | | | | | |
| Normal conditions 300° C. | ○ | ○ | ○ | ○ | ○ | ○ |
| Moisture absorption 260° C. | ○ | ○ | ○ | ○ | ○ | ○ |
| Flame retardancy (UL94, VTM-0) | ○ | x | ○ | x | ○ | ○ |
| Anti-migration properties | | | | | | |
| Evaluation of single layer structure | x | ○ | ○ | x | x | x |
| Evaluation of multilayer structure | x | x | x | x | x | x |

Properties of Adhesive Sheets

Example 5

Combining the adhesive composition components in the proportions shown in the column labeled "blend example 1" in Table 1, a dispersion was prepared in the same manner as the example 1. Subsequently, an applicator was used to apply the dispersion to the surface of a release-treated polyester film, in sufficient quantity to generate a dried coating of the composition with a thickness of 25 μm, and the applied coating was then dried for 10 minutes at 120° C. in a forced air oven, thereby converting the composition to a semi-cured state, and completing preparation of an adhesive sheet.

Comparative Example 11

With the exception of combining the adhesive composition components in the proportions shown in the column labeled "comparative blend example 2" in Table 1, an adhesive sheet was prepared in the same manner as the example 5.

[Measurements]

The properties of the adhesive sheets prepared in the example 5 and the comparative example 11 were measured in accordance with the measurement methods 4 described below. The results of the measurements are shown in Table 3.

—Measurement Methods 4—

4-1. Peel Strength

An adhesive layer prepared by removing the polyester protective film from the adhesive sheet was sandwiched between a polyimide film B (brand name: Apical, manufactured by Kaneka Corporation, thickness: 75 μm) and a polyimide film C (brand name: Apical, manufactured by Kaneka Corporation, thickness: 25 μm), and a press device (temperature: 160° C., pressure: 3 MPa, time: 60 minutes) was then used to bond the films together, thereby completing preparation of a pressed sample. This pressed sample was then cut to a width of 1 cm and a length of 15 cm to form a test specimen. The polyimide film B (thickness: 75 μm) of this test specimen was secured, and the minimum value for the force required to peel the polyimide film C (thickness: 25 μm) at a speed of 50 mm/minute in a direction at an angle of 180 degrees to the surface of the polyimide film B under conditions at 25° C. was then measured, and this measured value was reported as the peel strength.

TABLE 3

| Measurement item | Example 5 | Comparative example 11 |
|---|---|---|
| Peel strength (N/cm) | 12.1 | 5.0 |

<Evaluations>

The compositions prepared in the blend examples 1, 2 and 3 satisfy the requirements of the present invention, and the flexible copper-clad laminates, coverlay films and adhesive sheets prepared using these compositions exhibited excellent levels of peel strength, solder heat resistance, flame retardancy, and anti-migration properties.

The composition prepared in the comparative blend example 1 lacks the ion scavenger or heavy metal deactivator (F) required by the present invention, and as a result, the anti-migration properties of the evaluated multilayer laminate were poor.

The composition prepared in the comparative blend example 4 does not contain the phosphinate (E) and the ion scavenger or heavy metal deactivator (F) required by the present invention, and exhibited poor levels of peel strength and anti-migration properties.

The compositions prepared in the comparative blend example 2, the comparative blend example 6 and the comparative blend example 8 do not contain the phosphinate (E) required by the present invention, and exhibited poor levels of peel strength and anti-migration properties. Furthermore, because these compositions used a phosphorus-based flame retardant with a lower phosphorus content than the phosphinate (E) of the present invention, although the quantity of flame retardant added was the same as that used in the blend example 1, the flame retardancy was inferior.

The compositions prepared in the comparative blend example 3, the comparative blend example 5, the comparative blend example 7 and the comparative blend example 9 do not contain the phosphinate (E) required by the present invention, and exhibited poor levels of peel strength and anti-migration properties.

INDUSTRIAL APPLICABILITY

A cured product produced by curing a flame retardant adhesive composition of the present invention, as well as a coverlay film, an adhesive sheet and a flexible copper-clad laminate produced using such a composition, all exhibit excellent peel strength, solder heat resistance and flame retardancy, and moreover, not only exhibit superior anti-migration properties in the type of single layer structure that is widely used conventionally, but also exhibit superior anti-migration properties in multilayer structures of much higher density, and are also halogen-free, meaning they offer considerable promise in applications such as the production of environmentally friendly flexible printed wiring boards.

What is claimed is:

1. A flame retardant adhesive composition comprising:
   (A) a halogen-free epoxy resin,
   (B) a carboxyl group-containing acrylic resin and/or a carboxyl group-containing acrylonitrile-butadiene rubber,
   (C) a curing agent,
   (E) a phosphinate represented by a general formula (1) shown below and/or a diphosphinate represented by a general formula (2) shown below:

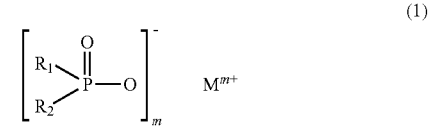

(wherein, $R_1$ and $R_2$ are either the same or different, and each represent a monovalent linear or branched alkyl group of 1 to 6 carbon atoms or an aryl group, M represents a metal selected from the group consisting of Mg, Ca, Al, Sb, Sn, Ge, Ti, Zn, Fe, Zr, Ce, Bi, Sr, Mn, Li, Na and K, or a protonated nitrogen base, and m represents an integer from 1 to 4),

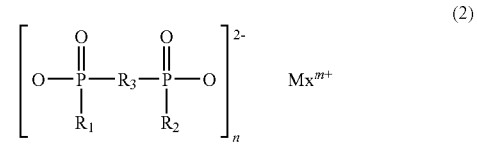

(wherein, $R_1$, $R_2$, M and m are as defined above, $R_3$ represents a bivalent linear or branched alkylene group of 1 to 10 carbon atoms, an arylene group of 6 to 10 carbon atoms, an alkylarylene group of 6 to 10 carbon atoms, or an arylalkylene group of 6 to 10 carbon atoms, n represents an integer from 1 to 4, and x represents an integer from 1 to 4, provided that 2n=mx), and (F) an ion scavenger and/or a heavy metal deactivator.

2. The flame retardant adhesive composition defined in claim 1, the composition comprising:

100 parts by mass of the halogen-free epoxy resin (A), 10 to 200 parts by mass of the carboxyl group-containing acrylic resin and/or carboxyl group-containing acrylonitrile-butadiene rubber (B), 0.5 to 20 parts by mass of the curing agent (C), sufficient quantity of the phosphinate represented by the general formula (1) and/or the diphosphinate represented by the general formula (2) (E) that a phosphorus content within the composition, relative to an organic resin component within the adhesive composition excluding inorganic solid components, is within a range from 2.0 to 4.5% by mass, and 0.1 to 5 parts by mass of the ion scavenger and/or heavy metal deactivator (F).

3. The flame retardant adhesive composition defined in claim 1, further comprising a curing accelerator (D).

4. The flame retardant adhesive composition defined in claim 1, wherein the carboxyl group-containing acrylic resin and/or carboxyl group-containing acrylonitrile-butadiene rubber of component (B) comprises from 1 to 10 mol % of carboxyl groups relative to a combined total of all monomers that constitute the acrylic resin and/or acrylonitrile-butadiene rubber.

5. The flame retardant adhesive composition defined in claim 1, wherein the carboxyl group-containing acrylic resin of component (B) is an acrylic polymer obtained by copolymerizing three components, namely (a) an acrylate ester and/or methacrylate ester, (b) acrylonitrile and/or methacrylonitrile, and (c) an unsaturated carboxylic acid.

6. An adhesive sheet, comprising a releasable base material, and a layer comprising the adhesive composition defined in claim 1 formed on one surface of the base material.

7. The adhesive sheet defined in claim 6, wherein a dried thickness of the layer comprising the adhesive composition is within a range from 5 to 50 μm.

8. A coverlay film, comprising an electrically insulating film, and a layer comprising the composition defined in claim 1 provided on at least one surface of the electrically insulating film.

9. The coverlay film defined in claim 8, wherein a thickness of the electrically insulating film is within a range from 9 to 50 μm, and a dried thickness of the layer comprising the adhesive composition is within a range from 5 to 45 μm.

10. The coverlay film defined in claim 8, wherein the electrically insulating film comprises a polyimide film or an aramid film.

11. The coverlay film defined in claim 10, wherein the electrically insulating film comprises a support film and an aramid film with a thickness of 3 to 9 μm supported on the support film.

12. The coverlay film defined in claim 8, comprising an electrically insulating film that comprises an aramid film with a thickness of 3 to 9 μm supported on a support film, a layer comprising the adhesive composition defined in claim 1 provided on at least one surface of the electrically insulating film, and a releasable base material provided on top of the layer comprising the adhesive composition.

13. A flexible copper-clad laminate, comprising an electrically insulating film, a layer comprising the adhesive composition defined in claim 1 provided on either one surface or both surfaces of the insulating film, and either a single copper foil layer or two copper foil layers provided on top of the one or two layers of the adhesive composition.

14. The flexible copper-clad laminate defined in claim 13, wherein the electrically insulating film comprises a polyimide film or an aramid film.

15. The flexible copper-clad laminate defined in claim 14, wherein the electrically insulating film comprises a support film and an aramid film with a thickness of 3 to 9 μm supported on the support film.

16. The flexible copper-clad laminate defined in claim 13, wherein a dried thickness of the layer comprising the adhesive composition is within a range from 5 to 45 μm.

* * * * *